(12) United States Patent
Barker et al.

(10) Patent No.: US 7,569,165 B2
(45) Date of Patent: *Aug. 4, 2009

(54) BLACK CONDUCTIVE COMPOSITIONS, BLACK ELECTRODES, AND METHODS OF FORMING THEREOF

(75) Inventors: Michael F. Barker, Raleigh, NC (US); Keiichiro Hayakawa, Tokyo (JP); Jerome David Smith, Cary, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/369,551

(22) Filed: Mar. 7, 2006

(65) Prior Publication Data

US 2006/0202174 A1  Sep. 14, 2006

Related U.S. Application Data

(60) Provisional application No. 60/660,013, filed on Mar. 9, 2005.

(51) Int. Cl.
*H01B 1/02* (2006.01)
*H01B 1/12* (2006.01)
*G03C 11/00* (2006.01)
*G03F 7/00* (2006.01)
*G03F 1/00* (2006.01)

(52) U.S. Cl. .............................. 252/518.1; 252/519.13; 252/519.33; 252/521.1; 430/198; 430/311; 430/321

(58) Field of Classification Search ................ 430/231, 430/198, 311, 321; 252/500, 518.1, 519.13, 252/519.33, 521.1

See application file for complete search history.

(56) References Cited

U.S. PATENT DOCUMENTS

| | | | |
|---|---|---|---|
| 2,760,863 | A | 8/1956 | Plambeck, Jr. |
| 2,850,445 | A | 9/1958 | Oster |
| 2,875,047 | A | 2/1959 | Oster |
| 2,927,022 | A | 3/1960 | Martin et al. |
| 3,074,974 | A | 1/1963 | Gebura |
| 3,097,096 | A | 7/1963 | Oster |
| 3,097,097 | A | 7/1963 | Oster et al. |
| 3,145,104 | A | 8/1964 | Oster et al. |
| 3,380,831 | A | 4/1968 | Cohen et al. |
| 3,427,161 | A | 2/1969 | Laridon et al. |
| 3,479,185 | A | 11/1969 | Chambers, Jr. et al. |
| 3,549,367 | A | 12/1970 | Chang et al. |
| 3,583,931 | A | 6/1971 | Bouchard |

(Continued)

OTHER PUBLICATIONS

Charles Kittel, Introduction to Solid State Physics, Third Edition, p. 253.

*Primary Examiner*—Mark Kopec
*Assistant Examiner*—Jaison P Thomas

(57) ABSTRACT

The invention is directed to black conductive composition(s), black electrodes made from such compositions and methods of forming such electrodes. In particular, the invention is directed to flat panel display applications, including alternating-current display panel applications. Still further, the invention is directed to composition(s) utilizing conductive metal oxides selected from an oxide of two or more elements selected from Ba, Ru, Ca, Cu, Sr, Bi, Pb, and the rare earth metals and photocrosslinkable polymers. These compositions are particularly useful in making photoimageable black electrodes for flat panel display applications.

14 Claims, 4 Drawing Sheets

U.S. PATENT DOCUMENTS

| | | | |
|---|---|---|---|
| 4,162,162 A | 7/1979 | Dueber et al. | |
| 4,912,019 A | 3/1990 | Nebe et al. | |
| 4,925,771 A | 5/1990 | Nebe et al. | |
| 5,049,480 A | 9/1991 | Nebe et al. | |
| 5,851,732 A | 12/1998 | Kanda et al. | |
| 6,054,545 A * | 4/2000 | Oshio et al. | 527/301 |
| 6,075,319 A | 6/2000 | Kanda et al. | |
| 6,342,322 B1 | 1/2002 | Kakinuma et al. | |
| 6,555,594 B1 * | 4/2003 | Fukushima et al. | 522/81 |
| 7,135,267 B2 * | 11/2006 | Yang et al. | 430/198 |

* cited by examiner

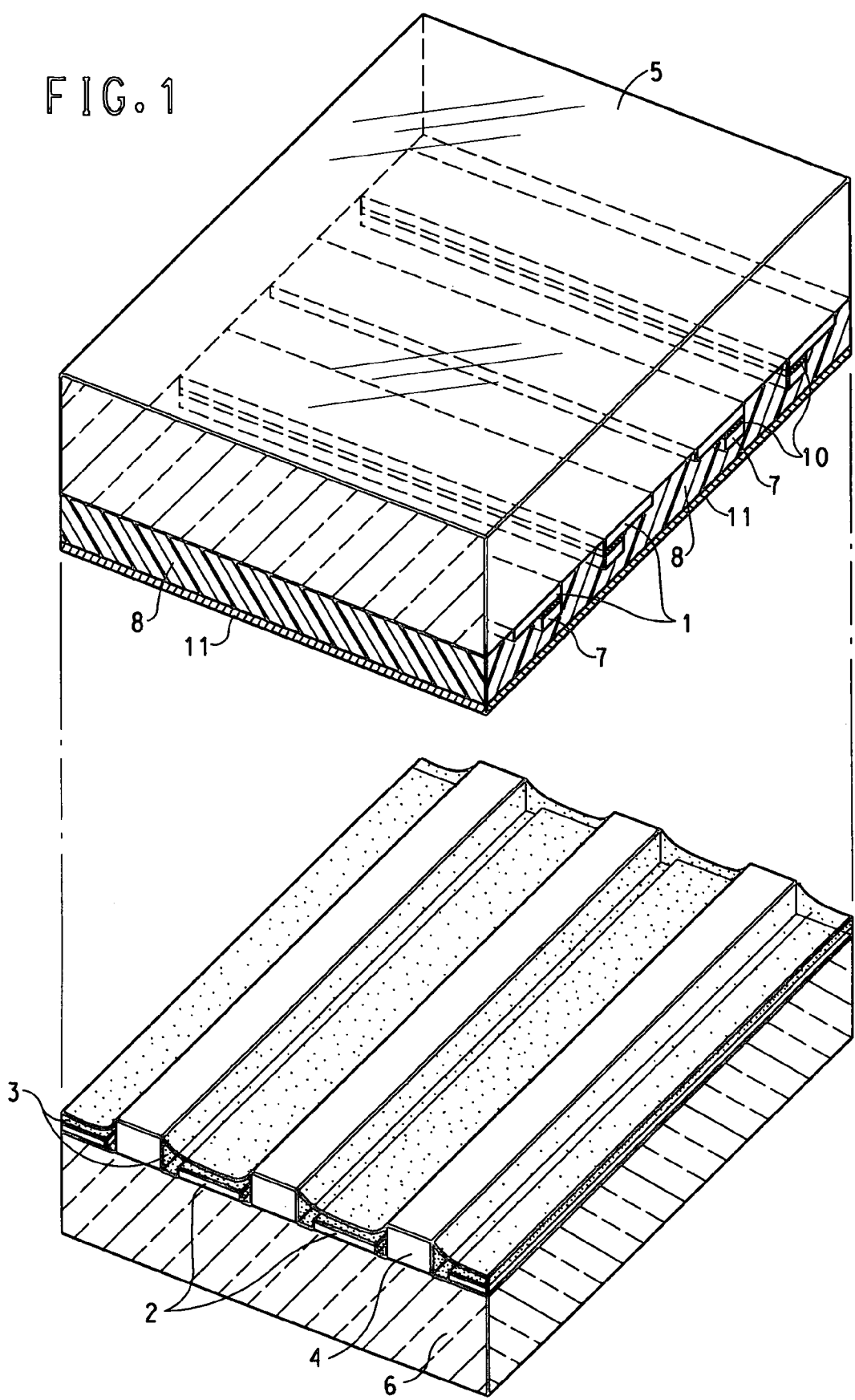

BLACK CONDUCTIVE COMPOSITIONS, BLACK ELECTRODES, AND METHODS OF FORMING THEREOF

CROSS-REFERENCE OF RELATED APPLICATION

This application claims the benefit of U.S. Provisional Application No. 60/660,013 filed Mar. 9, 2005.

FIELD OF THE INVENTION

The invention is directed to black conductive composition(s), black electrodes made from such compositions and methods of forming such electrodes. In particular, the invention is directed to flat panel display applications, including alternating-current display panel applications. Still further, the invention is directed to composition(s) utilizing conductive metal oxides selected from an oxide of two or more elements selected from Ba, Ru, Ca, Cu, Sr, Bi, Pb, and the rare earth metals and photocrosslinkable polymers. These compositions are particularly useful in making photoimageable black electrodes for flat panel display applications.

BACKGROUND OF THE INVENTION

Since it is the trend in the industry to make smaller and cheaper electronic devices and provide higher resolution for performance, it has become necessary to develop new photo-imageable materials to manufacture such devices. Photo-patterning technologies offer uniform finer lines and space resolution when compared to traditional screen-printing methods. A photo-patterning method, such as DuPont's FODEL® printing system, utilizes a photoimageable organic medium as found in U.S. Pat. No. 4,912,019, U.S. Pat. No. 4,925,771, and U.S. Pat. No. 5,049,480, whereby the substrate is first completely covered (printed, sprayed, coated or laminated) with the photoimageable thick film composition and dried. An image of the pattern is generated by exposure of the photoimageable thick film composition with actinic radiation through a photomask bearing a pattern. The exposed substrate is then developed. The unexposed portion of the pattern is washed away leaving the photoimaged thick film composition on the substrate that is then fired to remove organic materials and sinter inorganic materials. Such a photo-patterning method demonstrates line resolution of about 30 microns depending on the substrate smoothness, inorganic particle size distribution, exposure and development variables. It has been proven that such a technique is useful in the manufacture of flat panel display applications, such as plasma display panels.

Resolution and brightness of the images in the AC plasma display panel (PDP) device depend on electrode width, interconnecting conductor pitch and transparency of the dielectric layer. It is difficult to obtain fine line and space resolution for the formation of the electrodes and interconnecting conductor patterns when these materials are applied by conventional patterning techniques such as screen printing, sputtering or chemical etching methods. Moreover, to improve the display contrast, it is essential to decrease the reflection of external light from the electrodes and conductors arranged on the front glass substrate. This reflection decrease can be most easily accomplished by making the electrodes and conductors black as viewed through the front plate of the display.

Composition(s), such as that described in U.S. Pat. No. 6,342,322 to Kakinuma, disclose "a photosensitive composition, comprising in combination (a) a carboxyl group-containing photosensitive polymer … (b) a diluent, (c) a photopolymerization initiator; (d) an inorganic powder, and (e) a stabilizer … ". The photosensitive composition for use in a black matrix additionally contains a black pigment. Where the paste is required to have a black color tone, a black pigment which is formed of a metal oxide containing as a main component thereof one or more members selected from among Fe, Co, Cu, Cr, Mn, and Al may be additionally incorporated. These black pigments disclosed in Kakinuma may be conductive as in their pure state, but often decompose partially in the low softening point glass of the black conductive, resulting in a film which in its fired form is essentially non-conductive. In a two-layer structure (for example where the black conductive layer is adjacent to the patterned conductive tin oxide, $SnO_2$, or indium tin oxide, ITO, layer on the front panel, and a more conductive layer, typically make from finely divided Ag particles, is formed on top of the black conductive layer), enhanced conductivity in the black conductive layer improves electron flow from the bus electrodes to the patterned conductive $SnO_2$ or ITO layer.

Other black pigments, notably graphite and/or carbon black disclosed in Kakinuma degrade during firing in air and result in losses in both conductivity and the ability to provide contrast in the black conductive layer.

The present invention is directed to a photoimageable thick film composition containing photocrosslinkable polymers for use in photo-patterning methods. The composition(s) of the present invention are particularly useful in flat panel display applications, such as PDP devices, fabricated by using photoimageable thick film compositions for use in photo-patterning methods wherein a black electrode is present between the substrate and a conductor electrode arrangement, as described in U.S. Pat. Nos. 5,851,732 and 6,075,319. In particular, the photoimageable composition(s) of the present invention utilize metal oxide(s) of two or more rare earth metals, wherein such metal oxides have metallic or semi-metallic conductivity.

SUMMARY OF THE INVENTION

The invention is directed to a composition comprising: (I) finely divided particles of inorganic material comprising: (a) a conductive metal oxide with metallic or semi-metallic conductivity selected from an oxide of two or more elements selected from Ba, Ru, Ca, Cu, Sr, Bi, Pb, and the rare earth metals wherein said metal oxide has a surface to weight ratio in the range of 2 to 20 $m^2/g$; (b) inorganic binder having a glass transition temperature in the range of from 300 to 600° C., a surface area to weight ratio of no greater than 10 $m^2/g$ and at least 85 wt. % of the particles having a size in the range of 0.1-10 µm; dispersed in: (II) an organic medium comprising; (a) aqueous developable photocrosslinkable polymer which is a copolymer, interpolymer or mixture thereof, wherein each copolymer or interpolymer comprises (1) a nonacidic comonomer comprising a $C_{1-10}$ alkyl acrylate, $C_{1-10}$ alkyl methacrylate, styrene, substituted styrene or combination thereof and (2) an acidic comonomer comprising ethylenically unsaturated carboxylic acid containing moiety, wherein 2-20% of the carboxylic acid containing moiety is reacted with a reactive molecule having a first and second functional unit wherein the first functional unit is a vinyl group and the second functional unit is capable of forming a chemical bond by reaction with the carboxylic acid moiety; forming the copolymer, interpolymer or mixture thereof having an acid content of at least 10 wt. % of the total polymer weight; a glass transition temperature in the range of 50-150° C. and a weight average molecular weight in the range of 2,000-250,000; (b) an optional photoinitiation system; and (c) organic solvent. See definition of metal/semi-metallic in Introduction to Solid State Physics, Third Edition, Charles Kittel. Ed. P. 253.

The present invention is further directed to articles comprising a layer of the composition above wherein the organic have been substantially removed and the inorganic materials have sintered. A further embodiment includes electrodes formed from the composition above.

BRIEF DESCRIPTION OF THE DRAWINGS

FIG. 1 is a black electrode of the present invention.

DETAILED DESCRIPTION

Figure 2A:
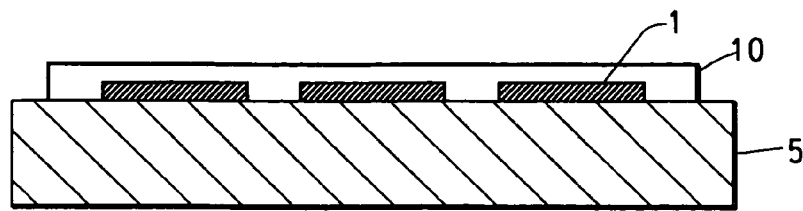
FIG. 2(a-e) describes the formation of one embodiment of the present invention.

The composition of the present invention uses photo-crosslinkable polymers in conjunction with inorganic materials, such as electrically conductive particles, and glass frit dispersed in organic medium. The main components of the photoimageable composition are discussed herein below.

I. Inorganic Materials

A. Conductive Metal Oxide Particles (Oxides with Metallic or Semi-Metallic Conductivity)

The conductive black compositions of the present invention contain finely divided particles of inorganic material comprising an oxide of two or more elements selected from Ba, Ru, Ca, Cu, Sr, Bi, Pb, and the rare earth metals. In particular, these oxides are metal oxides with metallic or semi-metallic conductivity. Rare earth metals include Scandium (Sc) and Yttrium (Y) (atomic numbers 21 and 39) and the lanthanide elements, which include La, Ce, Pr, Nd, Pm, Sm, Eu, Gd, Tb, Dy, Ho, Er, Tm, Yb, and Lu (atomic numbers 57 through 71). Preferred oxides are oxides of two or more elements selected from Ba, Ru, Ca, Cu, La, Sr, Y, Nd, Bi, and Pb.

The surface area to weight ratio of the metal oxide(s) of the present invention is in the range of 2 to 20 $m^2/g$. In one embodiment, the range is 5 to 15 $m^2/g$. In a further embodiment, the range of surface area to weight ratio is 6 to 10 $m^2/g$.

B. Optional Electrically Conductive Particles

The conductive black compositions of the invention may further contain $RuO_2$ and/or ruthenium based polynary oxides as a conductive metal oxide component.

Ruthenium based polynary oxides are one type of pyrochlore oxide that is a multicomponent compound of $Ru^{+4}$, $Ir^{+4}$, or their mixture (M") represented by the following general formula:

$$(M_xBi_{2-x})(M'_yM''_{2-y})O_{7-z}$$

M is chosen from a group consisting of yttrium, thallium, indium, cadmium, lead, copper, and rare earth materials.

M' is chosen from a group consisting of platinum, titanium, chromium, rhodium, and antimony.

M" is ruthenium, iridium or their mixture, x is 0-2 but x≦1 for univalent copper, y is 0-0.5 but when M' is rhodium or is more than 1 of platinum, titanium, chromium, rhodium, or antimony, y is 0-1, and z is 0-1 but when M is bivalent lead or cadmium, this is at least equal to about x/2.

The ruthenium pyrochlore oxides are found in detail in U.S. Pat. No. 3,583,931 which is incorporated herein by reference.

Preferable ruthenium polynary oxides are bismuth ruthenate $Bi_2Ru_2O_7$, lead ruthenate $Pb_2Ru_2O_6$, $Pb_{1.5}Bi_{0.5}Ru_2O_{6.5}$, $PbBiRu_2O_{6.75}$ and $GdBiRu_2O_6$. These materials can easily be obtained in pure form. They are not adversely affected by glass binders and are stable even when heated to about 1000° C. in air.

The ruthenium oxides and/or ruthenium pyrochlore oxides are used in proportions of 4-50 wt %, preferred 6-30%, more preferred 5-15% and most preferred 9-12%, based on the weight of the entire composition including the organic medium.

Optionally, the composition of the present invention may further comprise precious metals including gold, silver, platinum, palladium, copper and mixtures thereof. These electrically conductive metals may be optionally added to the black composition. Virtually any shape metal powder, including spherical particles and flakes (rods, cones, and plates) may be used in practicing the invention. The preferred metal powders are gold, silver, palladium, platinum, copper or combinations thereof. It is preferred that the particles be spherical. It has been found that the dispersion of the invention must contain no significant amount of solids having a particle size of less than 0.1 μm. When particles of this small size are present it is difficult to adequately obtain complete burnout of the organic medium when the films or layers thereof are fired to remove the organic medium and to effect sintering of the inorganic binder and the metal solids. When the dispersions are used to make thick film pastes, which are usually applied by screen printing, the maximum particle size must not exceed the thickness of the screen. It is preferred that at least 80 percent by weight of the conductive solids fall within the 0.5-10 μm range.

The black conductive compositions of the present invention can be used for the black electrode layer in the two-layer structure of a bus electrode. Typically, a bus electrode comprises a highly conductive metal layer and a black electrode as its under layer (between the bus electrode and transparent substrate). The compositions of the present invention are suitable for such applications. The black electrode layer of the present invention comprises the conductive metal oxides, as described in (A) above as a necessary component. In addition to the conductive metal oxides of (A) above, the black electrode layer may also, optionally comprise the optional electrically conductive metal particles described in (B). When the black electrode layer comprises the conductive metal particles of (B), in particular the optional precious metals including gold, silver, platinum, palladium, copper, and mixtures thereof, a single layer structure can be used (i.e., the highly conductive metal layer and black electrode layer are combined in one layer).

In addition, it is preferred that the surface area to weight ratio of the optional electrically conductive metal particles not exceed 20 $m^2/g$, preferably not exceed 10 $m^2/g$ and more preferably not exceed 5 $m^2/g$. When metal particles having a surface area to weight ratio of greater than 20 $m^2/g$ are used, the sintering characteristics of the accompanying inorganic binder are adversely affected. It is difficult to obtain adequate burnout and blisters may appear.

Often although not required, copper oxide is added to improve adhesion. The copper oxide should be present in the form of finely divided particles, preferably ranging in size from about 0.1 to 5 microns. When present as $Cu_2O$, the copper oxide comprises from about 0.1 to about 3 percent by weight of the total composition, and preferably from about 0.1 to 1.0 percent. Part or all of the $Cu_2O$ may be replaced by molar equivalents of CuO.

C. Inorganic Binder

The electrically conductive powders described herein above are finely dispersed in an organic medium and are accompanied by inorganic binders and are optionally accompanied by metal oxides, ceramics, and fillers, such as other powders or solids.

The function of an inorganic binder and generally a glass frit used in this invention is to bind the particles to one another and to the substrate after firing. Examples of inorganic binders include glass binders (frits), metal oxides and ceramics. Many of the glass binders useful in the composition are conventional in the art. Some examples include borosilicate and aluminosilicate glasses. Examples further include combinations of oxides, such as: $B_2O_3$, $SiO_2$, $Al_2O_3$, CdO, CaO, BaO, ZnO, $SiO_2$, $Na_2O$, $Li_2O$, PbO, and ZrO which may be used independently or in combination to form glass binders. Typical metal oxides useful in thick film compositions are conventional in the art and can be, for example, ZnO, MgO, CoO, NiO, FeO, MnO and mixtures thereof.

The glass frits most preferably used are the borosilicate frits, such as lead borosilicate frit, bismuth, cadmium, barium, calcium, or other alkaline earth borosilicate frits. The preparation of such glass frits is well known and consists, for example, in melting together the constituents of the glass in the form of the oxides of the constituents and pouring such molten composition into water to form the frit. The batch ingredients may, of course, be any compounds that will yield the desired oxides under the usual conditions of frit production. For example, boric oxide will be obtained from boric acid, silicon dioxide will be produced from flint, barium oxide will be produced from barium carbonate, etc. The glass is preferably milled in a ball mill with water to reduce the particle size of the frit and to obtain a frit of substantially uniform size. It is then settled in water to separate fines and the supernatant fluid containing the fines is removed. Other methods of classification may be used as well.

In one embodiment, the glass binder is a Pb-free Bi based amorphous glass frit. Other possible lead-free, low-melting glasses are P based or Zn—B based compositions. However, P based glass does not have good water resistance, and Zn—B glass is difficult to obtain in the amorphous state, hence Bi based glasses are preferred. Bi glass can be made to have a relatively low melting point without adding an alkali metal and has little problems in making a powder. In the present invention, Bi glass having the following characteristics is most preferred for lead free compositions.

(I) Lead Free Glass Composition:

| | |
|---|---|
| 55-85 wt % | $Bi_2O_3$ |
| 0-20 wt % | $SiO_2$ |
| 0-5 wt % | $Al_2O_3$ |
| 2-20 wt % | $B_2O_3$ |
| 0-20 wt % | ZnO |
| 0-15 wt % | one or more of oxides selected from BaO, CaO, and SrO (in the case of an oxide mixture, the maximum total is up to 15 wt %) |
| 0-3 wt % | one or more of oxides selected from $Na_2O$, $K_2O$, $Cs_2O$ and $Li_2O$ (in the case of an oxide mixture, the maximum total is up to 3 wt %) |

(II) Softening Point: 400-600° C.

In this specification, "softening point" means the softening point determined by differential thermal analysis (DTA).

The glass binders used in the present invention preferably have a $D_{50}$ (i.e., the point at which ½ of the particles are smaller than and ½ are larger than the specified size) of 0.1-10 µm as measured by a Microtrac. More preferably, the glass binders have a $D_{50}$ of 0.5 to 1 µm. Usually, in an industrially desirable process, a glass binder is prepared by the mixing and melting of raw materials such as oxides, hydroxides, carbonates, etc., making into a cullet by quenching, mechanical pulverization (wet, dry), then drying in the case of wet pulverization. Thereafter, if needed, classification is carried out to the desired size. It is desirable for the glass binder used in the present invention to have an average particle diameter smaller than the thickness of the black conductive layer to be formed.

II. Organic Medium

The main purpose of the organic medium is to serve as a vehicle for dispersion of the finely divided solids of the composition in such form that it can readily be applied to a ceramic or other substrate. Thus, the organic medium must first be one in which the solids are dispersible with an adequate degree of stability. Secondly, the rheological properties of the organic medium must be such that they lend good application properties to the dispersion. The main components of the medium follow:

A. Photocrosslinkable Organic Polymer

The polymer binder is important to the compositions of this invention. They have aqueous developability and give a high resolving power.

They are photocrosslinkable polymer binders. They are made of copolymer, interpolymer or mixtures thereof, wherein each copolymer or interpolymer comprises (1) a nonacidic comonomer comprising a $C_{1-10}$ alkyl acrylate, $C_{1-10}$ alkyl methacrylate, styrenes, substituted styrenes or combinations thereof and (2) an acidic comonomer comprising ethylenically unsaturated carboxylic acid containing moiety, wherein 2-20% of the carboxylic acid containing moiety is reacted with a reactive molecule having a first and second functional unit, wherein the first functional unit is a vinyl group and the second functional unit is capable of forming a chemical bond by reaction with the carboxylic acid moiety. Examples of the vinyl group include, but are not limited to methacrylate and acrylate groups. Examples of the second functional unit include, but are not limited to epoxides, alcohols and amines. The resultant copolymer, interpolymer or mixture thereof has an acid content of at least 10 wt. % of the total polymer weight; a glass transition temperature of 50-150° C. and an weight average molecular weight in the range of 2,000-250,000 and all ranges contained within.

The presence of acidic comonomer components in the composition is important in this technique. The acidic functional group provides the ability to be developed in aqueous bases such as aqueous solutions of 0.4-2.0% sodium carbonate. When acidic comonomers are present in concentrations of less than 10%, the composition is not washed off completely with an aqueous base. When the acidic comonomers are present at concentrations greater than 30%, the composition is less resistant under development conditions and partial development occurs in the image portions. Appropriate acidic comonomers include ethylenically unsaturated monocarboxylic acids such as acrylic acid, methacrylic acid, or crotonic acid and ethylenically unsaturated dicarboxylic acids such as fumaric acid, itaconic acid, citraconic acid, vinyl succinic acid, and maleic acid, as well as their hemiesters, and in some cases their anhydrides and their mixtures. Because they are cleaner burning in low-oxygen atmospheres, methacrylic polymers are preferred over acrylic polymers.

When the nonacidic comonomers are alkyl acrylates or alkyl methacrylates as mentioned above, it is preferable that these nonacidic comonomers constitute at least 50 wt. %, preferably 70-75 wt. %, of the polymer binder. When the nonacidic comonomers are styrene or substituted sytrenes, it is preferable that these nonacidic comonomers constitute 50 wt. % of the polymer binder and that the other 50 wt. % is an acid anhydride such as the hemiester of maleic anhydride. A favorable substituted styrene is alpha-methylstyrene.

Although not preferable, the nonacidic portion of the polymer binder can contain up to about 50 wt. % of other nonacidic comonomers as substitutes for the alkyl acrylate, alkyl methacrylate, styrene, or substituted styrene portions of the polymer. Examples include acrylonitrile, vinyl acetate, and acrylamide. However, because it is more difficult for these to completely burn out, it is preferable that less than about 25 wt. % of such monomers in the total polymer binder are used. The use of single copolymers or combinations of copolymers as binders are recognized as long as each of these satisfies the various standards above. In addition to the above copolymers, adding small amounts of other polymer binders is possible. For examples of these, polyolefins such as polyethylene, polypropylene, polybutylene, polyisobutylene, and ethylene-propylene copolymers, polyvinyl alcohol polymers (PVA), polyvinyl pyrrolidone polymers (PVP), vinyl alcohol and vinyl pyrrolidone copolymers, as well as polyethers that are low alkylene oxide polymers such as polyethylene oxide can be cited.

The acidic comonomer provides the polymer with a reactive site to introduce a reactive molecule such as photo-crosslinkable functional units. This is accomplished by utilizing 2-20% of the carboxylic acid containing moiety reacting with the reactive molecule that contains a vinyl unit, as shown in the schematic below. The final polymer has repeating units, as shown. These polymers are well known to those skilled in the art.

Where:

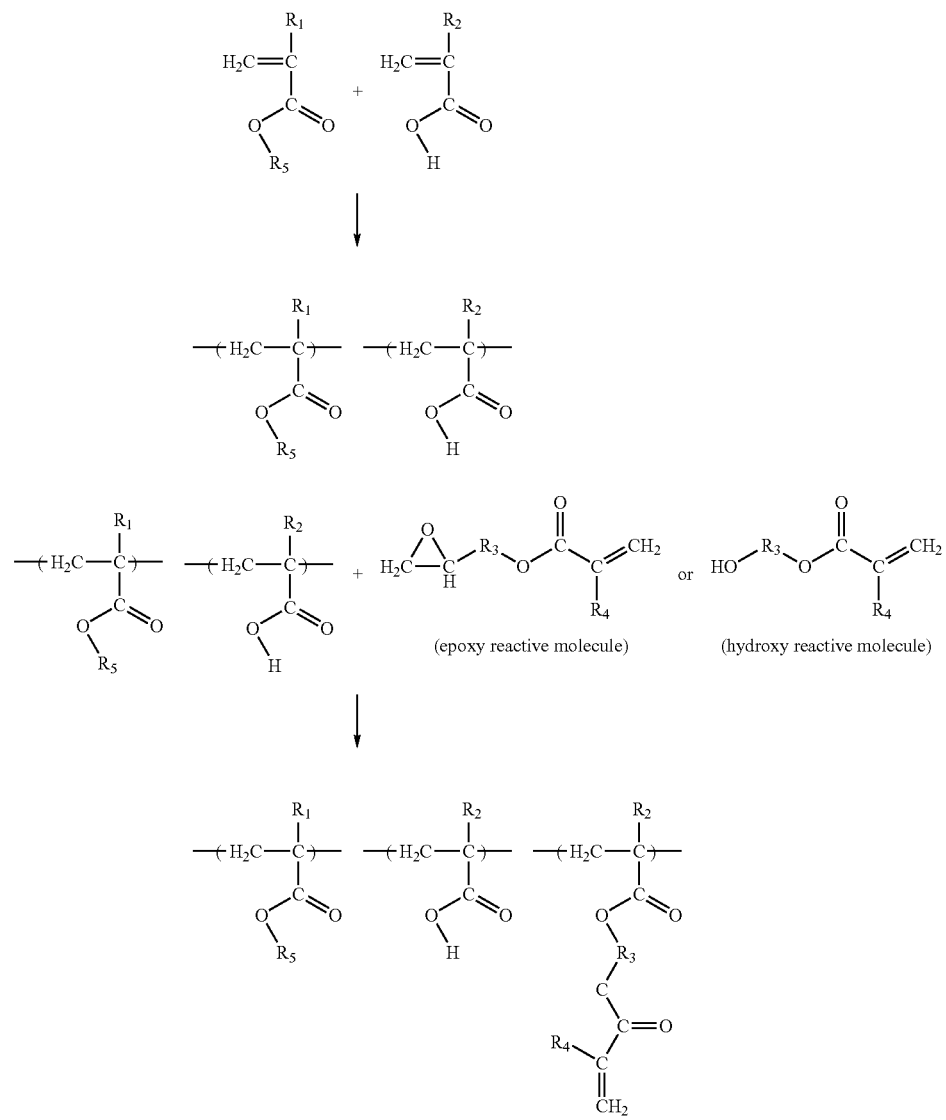

$R_1$, $R_2$ and $R_4$ are methyl group or hydrogen or a mixture thereof;

$R_3$ is a straight, branched or ring alkyl group which may contain aromatic groups or other atoms, for example, oxygen; and $R_5$ is an alkyl ($C_1$-$C_{10}$).

The polymers described herein can be produced by those skilled in the art of acrylate polymerization by commonly used solution polymerization techniques. Typically, such acidic acrylate polymers are produced by mixing □- or □-ethylenically unsaturated acids (acidic comonomers) with one or more copolymerizable vinyl monomer (nonacidic comonomers) in a relatively low-boiling-point (75-150° C.) organic solvent to obtain a 10-60% monomer mixture solution, then polymerizing the monomers by adding a polymerization catalyst and heating the mixture under normal pressure to the reflux temperature of the solvent. After the polymerization reaction is essentially complete, the acidic polymer solution produced is cooled to room temperature.

A reactive molecule, a free radical polymerization inhibitor and a catalyst are added to the cooled polymer solution described above. The solution is stirred until the reaction is complete. Optionally, the solution may be heated to speed up the reaction. After the reaction is complete and the reactive molecules are chemically attached to the polymer backbone, the polymer solution is cooled to room temperature, samples are collected, and the polymer viscosity, molecular weight, and acid equivalents are measured.

Furthermore, the weight average molecular weight of the polymer binder is in the range of 2,000-250,000 and any ranges contained therein. The molecular weight of the polymer binder will depend on the application. Weights less than 10,000 are generally useful in paste compositions and above 10,000 are generally useful in tapes or sheets. Polymers with molecular weight less than 10,000 generally have lower film forming ability. They may be used in tape formulations but generally require mixing with other compatible high molecular weight polymers to form a film or tape.

The total polymer in the composition is in the range of 5-70 wt. % based on total composition and any ranges contained therein.

B. Photohardenable Monomer

Conventional photohardenable methacrylate monomers may be used in the invention. Depending on the application, it is not always necessary to include a monomer in the composition of the invention. Monomer components are present in amounts of 1-20 wt. %, based on the total weight of the dry photopolymerizable layer. Such preferred monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethyacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. Nos. 3,380,831, 2,2-di(p-hydroxy-phenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di-(p-hydroxyphenyl)propane dimethacrylate, di-(3-methacryloxy-2-hydroxypropyl)ether of bisphenol-A, di-(2-methacryl-oxyethyl) ether of bisphenol-A, di-(3-acryloxy-2-hydroxypropyl)ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a weight average molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of free radical polymerizable ethylenic linkages particularly when present as terminal linkages. Particularly preferred monomers are polyoxyethylated trimethylolpropane triacrylate, ethylated pentaerythritol triacrylate, dipentaerythritol monohydroxypentaacrylate and 1,10-decanediol dimethylacrylate.

C. Photoinitiation System

Suitable photoinitiation systems are those, which generate free radicals upon exposure to actinic light at ambient temperature. These include the substituted or unsubstituted polynuclear quinones which are compounds having two intracyclic carbon atoms in a conjugated carbocyclic ring system, e.g., 2-benzyl-2-(dimethylamino)-1-(4-morpholinophenyl)-1-butanone, 2,2-dimethoxy-2-phenylacetophenone, 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz(a)anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthracene-5,12-dione, and 1,2,3,4-tetrahydrobenz(a)anthracene-7,12-dione. Other photoinitiators which are also useful, even though some may be thermally active at temperatures as low as 85 degrees C., are described in U.S. Pat. No. 2,760,863 and include vicinal ketaldonyl alcohols such as benzoin, pivaloin, acyloin ethers, e.g., benzoin methyl and ethyl ethers; alpha-hydrocarbon-substituted aromatic acyloins, including alpha-methylbenzoin, alpha-allylbenzoin and alpha-phenylbenzoin, thioxanthone and/or thioxanthone derivatives and the appropriate hydrogen donors. Photoreducible dyes and reducing agents disclosed in U.S. Pat. Nos. 2,850,445, 2,875,047, 3,097,096, 3,074,974, 3,097,097, and 3,145,104, as well as dyes of the phenazine, oxazine, and quinone classes, Michler's ketone, benzophenone, 2,4,5-triphenylimidazolyl dimers with hydrogen donors including leuco dyes and mixtures thereof as described in U.S. Pat. Nos. 3,427,161, 3,479,185, and 3,549,367 can be used as initiators. Also useful with photoinitiators and photoinhibitors are sensitizers disclosed in U.S. Pat. No. 4,162,162. The photoinitiator or photoinitiator system is present in 0.05 to 10% by weight based on the total weight of a dry photopolymerizable layer.

D. Solvents

The solvent component of the organic medium, which may be a mixture of solvents, is chosen so as to obtain complete solution therein of the polymer and other organic components. The solvent should be inert (non-reactive) towards the other constituents of the composition. For screen printable and photoimageable pastes, the solvent(s) should have sufficiently high volatility to enable the solvent to be evaporated from the dispersion by the application of relatively low levels of heat at atmospheric pressure however the solvent should not be so volatile that the paste rapidly dries on a screen, at normal room temperatures, during the printing process. The preferred solvents for use in the paste compositions should have boiling points at atmospheric pressure of less than 300° C. and preferably less than 250° C. Such solvents include aliphatic alcohols, esters of such alcohols, for example, acetates and propionates; terpenes such as pine oil and alpha- or beta-terpineol, or mixtures thereof; ethylene glycol and esters thereof, such as ethylene glycol monobutyl ether and butyl cellosolve acetate; carbitol esters, such as butyl carbitol, butyl carbitol acetate and carbitol acetate and other appropriate solvents such as Texanol® (2,2,4-trimethyl-1,3-pentanediol monoisobutyrate). For casting tapes, the solvent(s) have lower boiling points than solvents used for screen printable pastes. Such solvents include ethylacetate, methanol, isoproanol, acetone, xylene, ethanol, methylethyl ketone and toluene.

E. Other Additives

Frequently the organic medium will also contain one or more plasticizers. Such plasticizers help to assure good lamination to substrates and enhance the developability of unexposed areas of the composition. The choice of plasticizers is determined primarily by the polymer that must be modified. Among the plasticizers which have been used in various binder systems are diethyl phthalate, dibutyl phthalate, butyl benzyl phthalate, dibenzyl phthalate, alkyl phosphates, polyalkylene glycols, glycerol, poly (ethylene oxides), hydroxy ethylated alkyl phenol, tricresyl phosphate triethyleneglycol diacetate and polyester plasticizers. Additional components known in the art may be present in the composition including dispersants, stabilizers, release agents, dispersing agents, stripping agents, antifoaming agents and wetting agents. A general disclosure of suitable materials is presented in U.S. Pat. No. 5,049,480.

General Paste Preparation

Typically, thick film compositions are formulated to have a paste-like consistency, and are called "pastes". Generally, the pastes are prepared under yellow light by mixing the organic vehicle, monomer (s), and other organic components in a mixing vessel. The inorganic materials are then added to the mixture of organic components. The total composition is then mixed until the inorganic powders are wetted by the organic materials. The mixture is then roll milled using a three roll mill. The paste viscosity at this point could be adjusted with the appropriate vehicle or solvent to achieve a viscosity optimum for processing.

Care is taken to avoid dirt contamination in the process of preparing paste compositions and in preparing parts, since such contamination can lead to defects.

General Firing Profile

The composition of the present invention may be processed by using a firing profile. Firing profiles are well within the knowledge of those skilled in the art of thick film technology. Removal of the organic medium and sintering of the inorganic materials is dependent on the firing profile. The profile will determine if the medium is substantially removed from the finished article and if the inorganic materials are substantially sintered in the finished article. The term "substantially" as used herein means at least 95% removal of the medium and sintering the inorganic materials to a point to provide at least adequate resistivity or conductivity for the intended use or application.

General Tape Preparation

The composition of the present invention may be used in the form of a tape. If the composition is to be used in the form of a tape, a slip is prepared and used for tape casting. Slip is a general term used for the composition in tape making and is a properly dispersed mixture of inorganic powders dispersed in an organic medium. A common way of achieving a good dispersion of inorganic powders in the organic medium is by using a conventional ball-milling process. A ball milling consists of ceramic milling jar and milling media (typically spherical or cylindrical shaped alumina or zirconia pellets). The total mixture is put into the milling jar and the milling media are added. After closing the jar with a leak-tight lid, it is tumbled to create a milling action of the milling media inside the jar at a rolling speed at which the mixing efficiency is optimized. The length of the rolling is the time required to attain well-dispersed inorganic particles to meet the performance specifications. The slip may be applied to a substrate by a blade or bar coating method, followed by ambient or heat drying. The coating thickness after drying may range from a few microns to several tens of microns depending on the application.

The tape may be laminated with a coversheet before it is wound as a widestock roll. Silicone coated terephthalate PET film, polypropylene, or polyethylene may be used as a coversheet. The coversheet is removed before laminated to the final substrate.

Flat Panel Display Applications

The present invention includes black electrodes formed from the above black conductive compositions. The black electrodes of the present invention can be favorably used in flat panel display applications, particularly in alternating-current plasma display panel devices. The black electrodes can be formed between the device substrate and conductor electrode array.

In one embodiment, the electrode of the present invention is used in AC PDP applications, as described below. It is understood that the compositions and electrodes of the present invention may be used in other flat panel display applications and their description in AC PDP devices is not intended to be limiting. An example of the black electrodes of the present invention used in an alternating-current plasma display panel is explained below. This description includes two-layer electrodes comprising a black electrode between the substrate and conductor electrode (bus electrode). It is further understood that a single layer electrode may be formed when the black composition comprises the additional optional precious metal or metals, typically silver. Also, the method for making an alternating-current plasma display panel device is outlined.

The alternating-current plasma display panel device consists of front and back dielectric substrates with a gap and an electrode array containing parallel first and second electrode composite groups in a discharge space filled with ionizing gas. The first and second electrode composite groups face each other perpendicularly with the discharge space in the middle. A certain electrode pattern is formed on the surface of the dielectric substrate, and a dielectric material is coated on the electrode array on at least one side of the dielectric substrate. In this device, at least the electrode composite on the front dielectric substrate is fitted with the conductor electrode array group connected to the bus conductor on the same substrate, and with the black electrode of the present invention formed between the above substrate and the above conductor electrode array.

FIG. 1 illustrates the black electrode of the present invention in an AC PDP. FIG. 1 shows the AC PDP using the black electrode of the present invention. As shown in FIG. 1, the AC PDP device has the following components: underlying transparent electrode (1) formed on glass substrate (5); black electrode (10) formed on the transparent electrode (1) (the black conductive composition of the present invention is used for the black electrode (10)); bus electrode (7) formed on the black electrode (10) (bus electrode (7) is a photosensitive conductor composition containing conductive metal particles from metals selected from Au, Ag, Pd, Pt and Cu or combinations thereof (this is explained in more detail below)). The black electrode (10) and bus conductor electrode (7) are exposed imagewise by actinic radiation to form a pattern, developed in a basic aqueous solution, and fired at an elevated temperature to remove the organic components and to sinter the inorganic material. The black electrode (10) and bus conductor electrode (7) are patterned using an identical or very similar image. The final result is a fired, highly conductive electrode composite, which appears to be black on the surface of the transparent electrode (1), and when placed on the front glass substrate, reflection of external light is suppressed.

The word 'black' used in this specification means a black color with significant visual contrast against a white background. Therefore, the term is not necessarily limited to black which possesses the absence of color. The degree of "blackness" may be measured with a calorimeter to determine an L-value. The L-value represents lightness where 100 is pure white and 0 is pure black. Although shown in FIG. 1, the transparent electrode described below is not necessary in forming the plasma display device of the present invention.

When a transparent electrode is used, $SnO_2$ or ITO is used for forming the transparent electrode (1), by chemical vapor deposition or electro-deposition such as ion sputtering or ion plating. The components of the transparent electrode and method for its formation in the present invention are those of the conventional AC PDP production technology, well known to those in the art.

As shown in FIG. 1, the AC PDP device of the present invention is based on a glass substrate having dielectric coating layer (8) and MgO coating layer (11) over the patterned and fired metallization.

The conductor lines are uniform in line width and are not pitted or broken, have high conductivity, optical clarity and good transparency between lines.

Next, a method for making both a bus electrode and black electrode over the optional transparent electrode on the glass substrate of the front plate of a PDP device is illustrated.

Figure 2B:
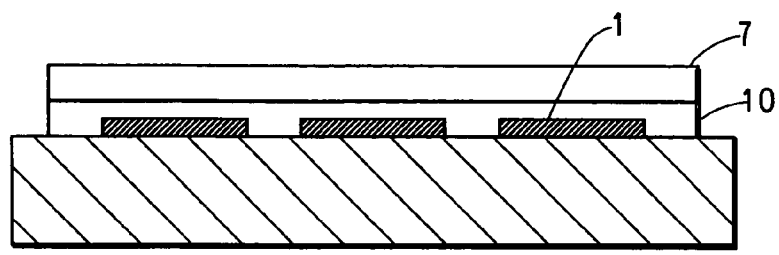
Figure 2C:
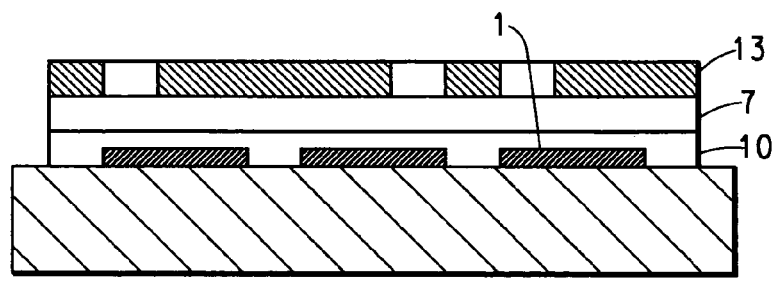
Figure 2D:
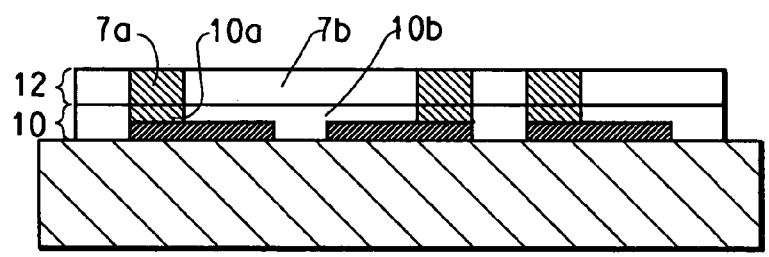
Figure 2E:
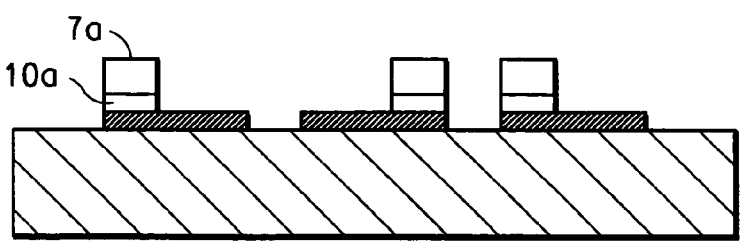

As shown in FIG. 2, the formation method of the one embodiment of the present invention involves a series of processes ((A)-(E)).

(A) A process of applying a black electrode-forming photosensitive thick film composition layer (10) on a transparent electrode (1) formed using $SnO_2$ or ITO according to a conventional method known to those in the art, on the glass substrate (5), then drying the thick film composition layer (10) in a nitrogen or air atmosphere. The black electrode composition is a lead-free black conductive composition of the present invention. (FIG. 2(A)).

(B) Applying to the first applied black electrode composition layer (10) a photosensitive thick film conductor composition (7) for forming the bus electrodes, then drying the thick film composition layer (7) in a nitrogen or air atmosphere. The photosensitive thick film conductive composition is described below. (FIG. 2(B)).

(C) Imagewise exposing the first applied black electrode composition layer (10) and the second bus electrode composition layer (7) to actinic radiation (typically a UV source) through a phototool or target (13) having a shape corresponding to a pattern of the black and bus electrodes arranged in correlation with the transparent electrodes (1), using exposure conditions that yield the correct electrode pattern after development. (FIG. 2(C))

(D) A process of developing the exposed parts (10a, 7a) of the first black conductive composition layer (10) and the second bus electrode composition layer (7) in a basic aqueous solution, such as a 0.4 wt % sodium carbonate aqueous solution or other alkali aqueous solution. This process removes the unexposed parts (10b, 7b) of the layers (10, 7). The exposed parts (10a, 7a) remain (FIG. 2 (D)). The developed product is then dried.

(E) After process, (D), the parts are then fired at a temperature of 450-650° C., depending upon the substrate material, to sinter the inorganic binder and conductive components (FIG. 2 (E)).

Figure 3A:
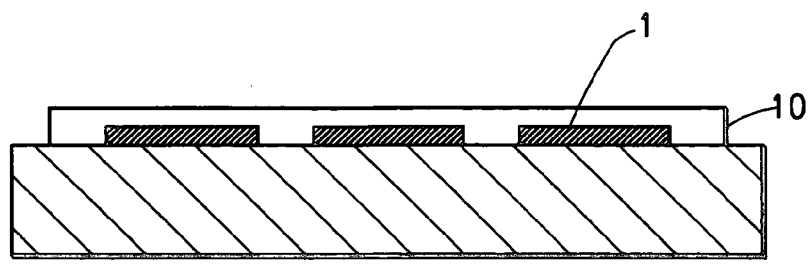
FIG. 3(a-h) describes the formation of a second embodiment of the present process. These a-h terms are referred to in the text at pages 20-21 as A'-H' to differentiate them from the embodiment of FIG. 2.
Figure 3B:
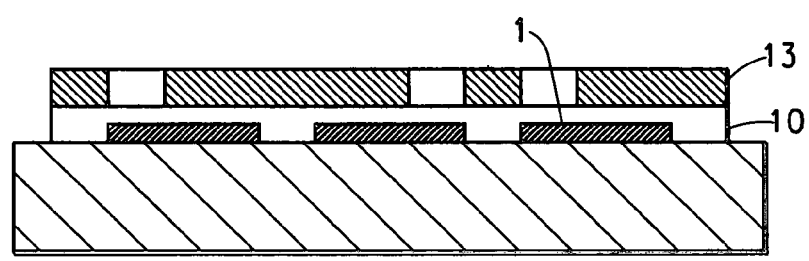
Figure 3C:
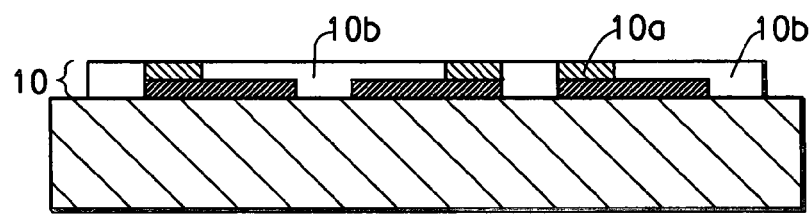
Figure 3D:
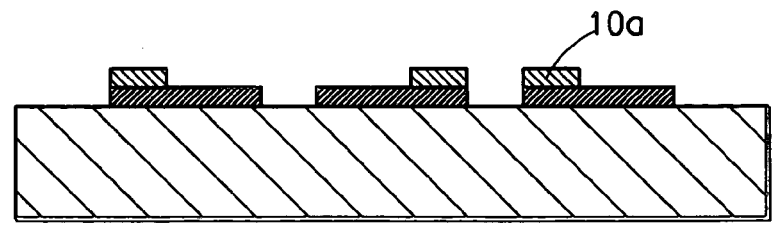
Figure 3E:
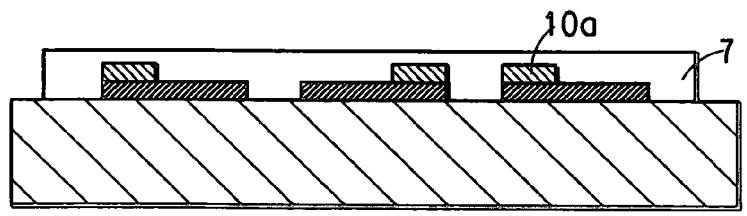
Figure 3F:
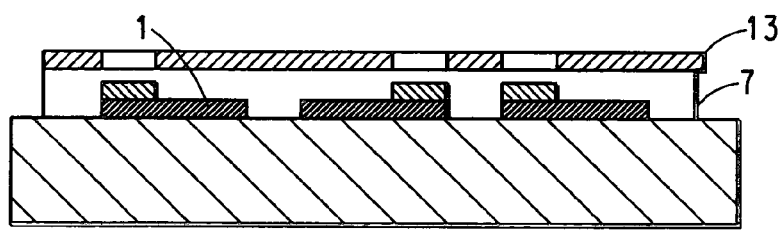
Figure 3G:
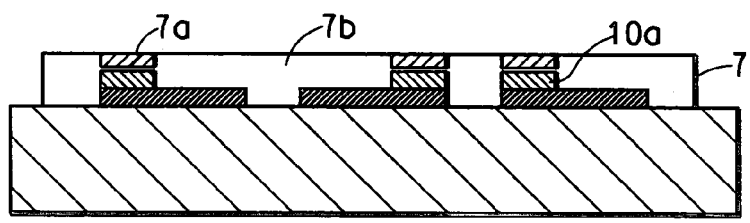
Figure 3H:
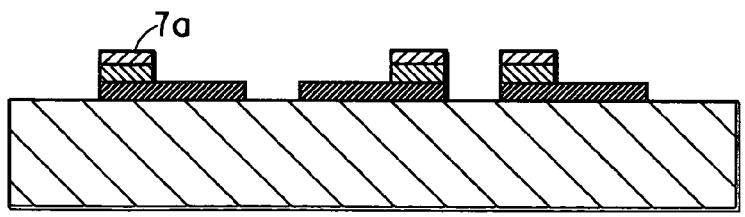

The formation method of the second embodiment of the present invention is explained below with FIG. 3. For convenience, the numbers assigned for each part of FIG. 3 are same as FIG. 2. The method of the second embodiment involves a series of processes (A'-H').

A'. A process of applying a black electrode-forming photosensitive thick film composition layer (10) on a transparent electrode (1) formed using $SnO_2$ or ITO according to a conventional method known to those in the art, on the glass substrate (5), then drying the thick film composition layer (10) in a nitrogen or air atmosphere. The black electrode composition is a lead-free black conductive composition of the present invention. (FIG. 3(A)).

B'. Imagewise exposing the first applied black electrode composition layer (10) to actinic radiation (typically a UV source) through a phototool or target (13) having a shape corresponding to a pattern of the black electrodes arranged in correlation with the transparent electrodes (1), using exposure conditions that yield the correct black electrode pattern after development. (FIG. 3(B)).

C'. A process of developing the exposed part (10a) of the first black conductive composition layer (10) in a basic aqueous solution such as a 0.4 wt % sodium carbonate aqueous solution or other alkali aqueous solution for removal of the unexposed parts (10b) of the layers (10) (FIG. 3 (C)). The developed product is then dried.

D'. After process, (C'), the parts are then fired at a temperature of 450-650° C., depending upon the substrate material, to sinter the inorganic binder and conductive components (FIG. 3(D)).

E'. A process of applying the bus electrode-forming photosensitive thick film composition layer (7) to the black electrode (10a) according to the fired and patterned part (10a) of the first photosensitive thick film composition layer (10), then drying in a nitrogen or air atmosphere. (FIG. 3(E)). The photosensitive thick film conductor composition is described below.

F'. Imagewise exposing the second applied bus electrode composition layer (7) to actinic radiation (typically a UV source) through a phototool or target (13) having a shape corresponding to a pattern of the bus electrodes arranged in correlation with the transparent electrodes (1) and black electrode (10a), using exposure conditions that yield the correct electrode pattern after development. (FIG. 3(F)).

G'. A process of developing the exposed part (7*a*) of the second bus conductive composition layer (7) in a basic aqueous solution such as a 0.4 wt % sodium carbonate aqueous solution or other alkali aqueous solution for removal of the unexposed parts (7*b*) of the layers (7) (FIG. 3 (G)). The developed product is then dried.

H'. After process, (G'), the parts are then fired at a temperature of 450-650° C., depending upon the substrate material, to sinter the inorganic binder and conductive components (FIG. 3 (H)).

The third embodiment (not shown) involves a series of processes ((i)-(v)) shown below. This embodiment is particularly useful for single layer electrode applications.

(i) The process of loading a black electrode composition on a substrate. This black electrode composition is the black conductive composition of the present invention described above.

(ii) The process of loading a photosensitive conductive composition on a substrate. This photosensitive conductive composition is described below.

(iii) The process of setting an electrode pattern by imagewise exposure of the black composition and conductive composition by actinic radiation.

(iv) The process of developing the exposed black composition and conductive composition by a basic aqueous solution for removal of the area not exposed to actinic radiation.

(v) The process of firing the developed conductive composition.

The front glass substrate assembly formed as described above can be used for a AC PDP. For example, referring back to FIG. 1, after forming the transparent electrode (1) in relation to the black electrode (10) and bus electrode (7) on the front glass substrate (5), the front glass substrate assembly is covered with dielectric layer (8), then coated with MgO layer (11). Next, the front glass substrate (5) is combined with rear glass substrate (6). A number of display cells screen printed with phosphor with cell barrier (4) formation are set on the rear glass (6). The electrode formed on the front substrate assembly is perpendicular to the address electrode formed on the rear glass substrate. The discharge space formed between the front glass substrate (5) and rear glass substrate (6) is sealed with a glass seal and at the same time a mixed discharge gas is sealed into the space. The AC PDP device is thus assembled.

Next, bus conductive compositions for bus electrodes are explained below.

The bus conductive compositions used in the present invention may be photosensitive thick film conductive compositions available commercially. As noted above, the bus conductive composition comprises (a) conductive metal particles of at least one metal selected from Au, Ag, Pd, Pt, and Cu and combinations thereof; (b) at least one inorganic binder; (c) photoinitiator; and (d) photocurable monomer. In one embodiment of the present invention, the bus conductive composition comprises Ag.

The conductive phase is the main component of the above composition, typically comprising silver particles with a particle diameter within the range of 0.05-20 μm (microns) in a random or thin flake shape. The bus conductive composition is herein described with reference to one embodiment comprising silver particles, but is not intended to be limiting. When a UV-polymerizable medium is used together with the composition, the silver particles should have a particle diameter within the range of 0.3-10μ. Preferred compositions should contain 65-75 wt % of silver particles based on the overall thick film paste.

The silver conductive composition for forming a bus electrode may also contain 0-10 wt % of a glass binder and/or 0-10 wt % of refractory materials that do not form glass or a precursor as needed, in addition to Ag. Examples of the glass binder include lead-free glass binders described above. Refractory materials that do not form glass and precursors are, e.g., alumina, copper oxide, gadolinium oxide, tantalum oxide, niobium oxide, titanium oxide, zirconium oxide, cobalt iron chromium oxide, aluminum, copper, various commercially available inorganic pigments, etc.

Objectives for adding the second, third, and more inorganic additives in addition to such main components are for control of the pattern shape, suppression or promotion of sintering during firing, adhesive property retention, control of the main-metal component diffusion, inhibition of discoloration near the bus electrode, control of resistance, control of the thermal expansion coefficient, mechanical strength retention, etc. The type and amount are selected as needed within the range of having no significant adverse effects on the basic performance.

Furthermore, the silver conductive compositions may also contain 10-30 wt % of a photosensitive medium in which the above particulate materials are dispersed. Such a photosensitive medium may be polymethyl methacrylate and a polyfunctional monomer solution. This monomer is selected from those with a low volatility for minimizing evaporation during the silver conductive composition paste preparation and printing/drying process before the UV curing. The photosensitive medium also contains a solvent and UV initiator. The preferred UV polymerizable medium includes a polymer based on methyl methacrylate/ethyl acrylate in a 95/5 ratio (weight based). The silver conductive composition described above has a viscosity of 10-200 Pa-s, for a free-flowing paste.

Suitable solvents for such a medium are, but not limited to, butyl Carbitol acetate, Texanol® and β-terpineol. Additional solvents that may be useful include those listed in Section (G) Organic Medium, above. Such a medium may be treated with dispersants, stabilizers, etc.

Test Procedures Used in the Examples

Dried Black Thickness

The dry film thickness of a black electrode was measured at 4 different points using a contact profilometer, such as a Tencor Alpha Step 2000.

Dried Ag/Black Thickness

The Ag electrode was printed on the dried black electrode then dried. The thickness of the Black/Ag composite layer was measured in the same way as the black electrode.

Line Resolution

Imaged samples are inspected using a zoom microscope at a minimum magnification of 20× with 10× oculars. The finest group of lines, which are completely intact without any shorts (connections between the lines) or opens (complete breaks in a line), is the stated line resolution for that sample.

4 mil Line Thickness

The fired film thickness is measured on the 4 mil width lines that are used to measure resistivity. Measurement is made using a contact profilometer.

4 mil Line Edge Curl

When the 4 mil line film thickness is measured, a devil's horn-shaped protrusion of the edges is observed in some cases, and the length of this devil's horn is called edge curl. With a large edge curl, after the transparent dielectric material is formed by printing, lamination, or coating, then fired; bubble inclusion is likely, leading to the possibility of dielectric breakdown, thus edge curl is not desired. No edge curl, i.e., edge curl being 0 μm, is most desirable. It is known that even with current lead-containing conductive compositions, the edge curl is about 1-3 μm.

Peeling

The degree of pattern corner lifting after firing is observed under a microscope and classified into levels of none, low, medium, med-high (or medium-high), and high. With currently available lead-containing conductive compositions a low level of corner lifting is observed. No corner lifting is most desirable.

Blistering

The degree of blistering after firing is observed under a microscope and classified into levels of low, low-medium, medium, medium-high, and high. With currently available lead-containing conductive compositions a low-medium level of blistering is observed. No blistering is most desirable.

L Value Ag/Black Two Layer

After firing, the blackness viewed from the back of the glass substrate is measured. For blackness, the color (L*) is measured using a calorimeter (Minolta CR-300) with calibration using a standard white plate. L* represents lightness with 0 being pure black and 100 pure white.

L Value of Single (Black Only) Layer

An ITO film-free glass substrate is coated with a black electrode as in (1) above and dried. Omitting each of the processes (2), (3), and (4), the dry black electrode thus obtained is fired under the same conditions of the process of (5) to form a single solid fired black electrode layer. After the firing, the blackness viewed from the back of the glass substrate is measured using a colorimeter (Minolta CR-300) under the conditions used for the above L value Ag/black two layer, with 0 being pure black and 100 pure white.

Black Resistance (Ohm)

In this evaluation, the resistance of the black electrode is measured. This method is used to confirm the conductive property of the fired black layer. Using the test part described above (L value of single layer), the resistance of the black electrode fired film is measured using a resistance meter with a probe distance of about 4 cm. Using this equipment, the maximum resistance that can be measured is 1 Gohm.

Black/Ag Resistivity (mohm/sq@5 μm)

This is the sheet resistance value (mΩ/sq) per unit of fired film thickness (5 μm). This value equates to 2 times the so-called specific resistance (μΩ-cm). When current lead-containing black conductive composition (DC243 paste of the DuPont Co.) and Ag electrode (DC209) are used, this value is known to be about 11-13 m ohm/sq@5 μm. The lower this value, the better.

Glossary of Materials Used in Examples

Organic Components

Monomer A: monomer TMPEOTA (trimethylolpropane ethoxytriacrylate)

Solvent A: solvent, Texanol

Organic additive A: additive, malonic acid

Organic additive B: additive BHT

Organic Binder A—in Weight Percent Total Organic Binder Composition

| Acrylic Resin A | 34.78 | Acrylic resin (Carboset XPD1234), methyl methacrylate 75%, methacrylic acid 25%, Mx = ~7000, Tg = 120° C., acid value = 164 |
| --- | --- | --- |
| Solvent A | 46.64 | Texanol |
| Resin B | 1.46 | PVP/VA, vinylpyrrolidone-vinyl acetate copolymer |
| Initiator A | 8.78 | Photoinitiator, DETX (diethylthioxanthone) |
| Initiator B | 8.28 | Photoinitiator, EDAB (ethyl 4-dimethylaminobenzoate) |
| Inhibitor A | 0.06 | Light stabilizer TAOBN (1,4,4-trimethyl-2,3-diazabicyclo[3.2.2]non-2-ene-N,N'-dioxide |

Organic Binder B—in Weight Percent Total Organic Binder Composition

| Acrylic Resin A | 36.16 | Acrylic resin (Carboset XPD1234), methyl methacrylate 75%, methacrylic acid 25%, Mx = ~7000, Tg = 120° C., acid value = 164 |
| --- | --- | --- |
| Solvent A | 55.27 | Texanol |
| Resin B | 1.53 | PVP/VA, vinylpyrrolidone-vinyl acetate copolymer |
| Initiator A | 2.27 | Photoinitiator, DETX (diethylthioxanthone) |
| Initiator B | 2.15 | Photoinitiator, EDAB (ethyl 4-dimethylaminobenzoate) |
| Initiator C | 2.55 | Photoinitiator, Irgacure 651 (Ciba Geigy Corp) |
| Inhibitor A | 0.07 | Light stabilizer TAOBN (1,4,4-trimethyl-2,3-diazabicyclo[3.2.2]non-2-ene-N,N'-dioxide |

Bi Glass Frit A

| $SiO_2$ | 7.1 | wt % | SA: 2.5-3.3 $m^2/g$ |
| --- | --- | --- | --- |
| $Al_2O_3$ | 2.1 | | |
| CaO | 0.5 | | PSD D50: 0.7-0.83 um |
| ZnO | 12.0 | | |
| $B_2O_3$ | 8.4 | | |
| $Bi_2O_3$ | 69.9 | | |

Ag Paste Component: Ag Paste A in Weight Percent Total Ag Paste Composition

| Ag paste A | Description | |
| --- | --- | --- |
| 19.5 | Organic Binder B | |
| 1.6 | Organic Binder A | |
| 4.46 | Solvent A | Texanol |
| 3.8 | Monomer A | Monomer, TMPEOTA (trimethylolpropane ethoxytriacrylate) |
| 0.14 | Organic Additive A | Malonic acid |
| 0.5 | Bi Frit A | |
| 70 | Ag powder | D50: 1.3 um spherical powder |

Preparation of Compositions Used in Examples

Preparation of Photosensitive Wet-Developable Pastes.
(A) Preparation of Organic Materials The solvent and acrylic polymer are mixed, stirred, and heated to 100° C. to achieve complete dissolution of the binder polymer. The resulting solution is cooled to 80° C., the remaining organic components are added, and the mixture stirred to achieve complete dissolution of all solids. The material is then filtered through a 325-mesh screen, and cooled.

(B) Preparation of Paste

The pastes are prepared under yellow light by mixing the organic vehicle, monomer(s), and other organic components in a mixing vessel. The inorganic materials are then added to the mixture of organic components. The total composition is then mixed until the inorganic powders are wetted by the organic materials. This mixture is roll-milled using a 3-roll mill. The paste viscosity at this point could be adjusted with the appropriate vehicle or solvent to achieve a viscosity for optimum processing.

Care is taken to avoid dirt contamination in the process of preparing paste compositions and in preparing parts, since such contamination can lead to defects.

(C) Preparation Conditions (1) Formation of Black Electrode

Depending on the composition and desired thickness after drying, the paste is applied to the glass substrate by screen printing, using a 200-400 mesh screen. The example black pastes were applied to the glass substrates by screen printing, using a 350 mesh polyester screen. Parts to be tested as a 2-layer structure were prepared on a glass substrate on which a transparent electrode (thin film ITO) has been formed. (Parts to be tested as a single layer (black only) structure were prepared on a glass substrate without the ITO film. Parts were then dried at 80° C. for 20 min in a hot-air circulation oven to form a black electrode with a dry film thickness of 2-6 μm.

Parts to be tested as a single layer (black only) structure were then fired (see process 5).

Parts to be tested as a 2-layer structure were then processed as shown below (see process 2-5).

(2) Formation of Bus Conductive Electrode

Next the 2-layer parts were overprinted with photoimageable Ag conductive paste by screen printing using a 325 stainless steel mesh screen. In the examples below, this photoimageable Ag conductive paste is a photosensitive Ag paste containing 0.5 wt % of bismuth glass frit A, and 70 wt % of Ag powder (average particle diameter: 1.3 μm). This part is dried again at a temperature of 80° C. for 20 min. The dry film thickness is 6-10 μm. The dry thickness for the two-layer structure is 10-16 μm.

(3) UV Pattern Exposure

The two-layer parts were exposed through a phototool using a collimated UV light source. Illumination: 5-20 mW/cm$^2$. exposure energy: 400 mj/cm$^2$; on contact exposure.

(4) Development

The exposed parts were developed using a conveyorized, spray processor containing a 0.5 wt % sodium carbonate aqueous solution as the developer solution. The developer solution temperature is maintained at 30° C., and the developer solution was sprayed at 10-20 psi. The parts were subjected to a development time of 20 seconds. (corresponding to 3-4 times TTC). The developed parts were dried by blowing off the excess water with a forced air stream.

(5) Firing

The dried parts were then fired in a belt furnace in an air atmosphere using a 2.5 hour profile reaching a peak temperature of 550° C. or 500° C. for 10 mins.

For the examples illustrated below, the electrode preparation conditions are as shown in (1)-(5) above.

EXAMPLES

Application Examples 1-10

The Ag conductive paste used in these examples was Ag paste A. Black conductive compositions were prepared with a range of black conductive oxide powders.

| Example | Black Conductive Oxide | Description | Specific Surface Area m$^2$/g |
|---|---|---|---|
| 1 | A | BaRuO$_3$ | 13.9 |
| 2 | B | BaRuO$_3$ | 0.2 |
| 3 | C | Ba Ruthenate/Titanate | 0.5 |
| 4 | D | CaRuO$_3$ | 0.2 |
| 5 | E | NdSr$_2$Cu$_3$O$_7$ | <1 |
| 6 | F | LaSrCuO$_4$ | <1 |
| 7 | G | LaBaCuO4 | <1 |
| 8 | H | YBa$_2$Cu$_2$O$_7$ | <1 |
| 9 | I | NdBa$_2$Cu$_3$O$_7$ | <1 |
| 10 | J | Bi$_2$Sr$_2$CaCu$_2$O$_8$ | <1 |

Examples 2-10 used conductive oxide powders with low specific surface area to weight ratio (<1 m$^2$/g). Example 1 used the same conductive oxide powder as example 2 but the specific surface area to weight ratio was significantly higher (13 m$^2$/g). All the compositions used contained the same glass binder (Bi glass frit A). Details of the black paste compositions tested are shown in Table 1. Using the above processes (1)-(5), test parts for a bus electrode-black electrode two-layer structure, and test parts for single layer black electrode were prepared and investigated for various properties. All parts fired to a peak temperature of 550° C. except where indicated otherwise.

TABLE 1

Black Paste Composition in Weight Percent Total Black Paste Composition

| Ingredients | Example 1 | Example 2 | Example 3 | Example 4 | Example 5 | Example 6 | Example 7 | Example 8 | Example 9 | Example 10 |
|---|---|---|---|---|---|---|---|---|---|---|
| Organic binder A | 27.5 | 27.5 | 27.5 | 27.5 | 27.5 | 27.5 | 27.5 | 27.5 | 27.5 | 27.5 |
| monomer A | 6 | 6 | 6 | 6 | 6 | 6 | 6 | 6 | 6 | 6 |
| solvent A | 4.55 | 4.55 | 4.55 | 4.55 | 4.55 | 4.55 | 4.55 | 4.55 | 4.55 | 4.55 |

TABLE 1-continued

Black Paste Composition in Weight Percent Total Black Paste Composition

| Ingredients | Example 1 | Example 2 | Example 3 | Example 4 | Example 5 | Example 6 | Example 7 | Example 8 | Example 9 | Example 10 |
|---|---|---|---|---|---|---|---|---|---|---|
| Organic Additive A | 0.8 | 0.8 | 0.8 | 0.8 | 0.8 | 0.8 | 0.8 | 0.8 | 0.8 | 0.8 |
| Organic Additive B | 0.15 | 0.15 | 0.15 | 0.15 | 0.15 | 0.15 | 0.15 | 0.15 | 0.15 | 0.15 |
| Bi glass Frit A | 47 | 47 | 47 | 47 | 47 | 47 | 47 | 47 | 47 | 47 |
| Conductive oxide A | 14 | | | | | | | | | |
| Conductive oxide B | | 14 | | | | | | | | |
| Conductive oxide C | | | 14 | | | | | | | |
| Conductive oxide D | | | | 14 | | | | | | |
| Conductive oxide E | | | | | 14 | | | | | |
| Conductive oxide F | | | | | | 14 | | | | |
| Conductive oxide G | | | | | | | 14 | | | |
| Conductive oxide H | | | | | | | | 14 | | |
| Conductive oxide I | | | | | | | | | 14 | |
| Conductive oxide J | | | | | | | | | | 14 |

The photosensitive Ag paste used for the upper layer Ag electrode contained 70% of Ag powder (average particle diameter: about 1.3 μm) and 0.5% of Bi glass frit A.

Results are given in Table 2.

TABLE 2

| Black Conductive Paste | Example 1 | Example 2 | Example 3 | Example 4 | Example 5 | Example 6 | Example 7 | Example 8 | Example 9 | Example 10 | DC243 |
|---|---|---|---|---|---|---|---|---|---|---|---|
| Ag Paste | A | A | A | A | A | A | A | A | A | A | A. DC209 |
| Black Conductive SA m$^2$/g | 13 | <1 | <1 | <1 | <1 | <1 | <1 | <1 | <1 | <1 | 9.0 |
| Dried Black thickness/um | 4.7 | 5.4 | 5.3 | 4.4 | 4.6 | 4.6 | 5.7 | 5.8 | 6.3 | 5.1 | 5.1 |
| Dried Ag/Black thickness/um | 13.9 | 14.7 | 14.1 | 13.60 | 14.4 | 13.5 | 13.2 | 14.1 | 15.2 | 13.7 | 15.7 |
| Line Resolution (um) | 60 | 70 | 60 | 60 | 60 | 60 | 60 | 60 | 60 | 70 | 50 |
| 4 mil line thickness/um | 8.0 | 8.1 | 8.4 | 8.8 | 9.6 | 10.8 | 11.9 | 15.0 | 11.0 | 16.8 | 9.2 |
| 4 mil line edge curl/um | 4.0 | 4.6 | 2.0 | 3.0 | * | * | * | * | 2.0 | * | 3.0 |
| Blistering - Parts fired at 550° C. | Med | Low/Med | Med | Low/Med | Med/High | High | High | High | High | High | Low |
| Blistering - Parts fired at 500° C. | NT | NT | NT | NT | Low | Low/Med | Low | Low | Low | Med/High | NT |

TABLE 2-continued

| Black Conductive Paste | Example 1 | Example 2 | Example 3 | Example 4 | Example 5 | Example 6 | Example 7 | Example 8 | Example 9 | Example 10 | DC243 |
|---|---|---|---|---|---|---|---|---|---|---|---|
| Peeling | Med | Med | Med/High | Med/High | High | High | High | Med | High | High | Low/Med |
| L value Ag/Black two layer | 7.1 | 37.2 | 37.9 | 45.2 | 47.8 | 49.7 | 49.8 | 46.9 | 49.5 | 58.8 | 6.8 |
| L of single layer (Black Only) | 5.1 | 30.0 | 34.6 | 36.4 | 42.0 | 51.0 | 27.9 | 40.4 | 43.7 | 67.4 | 4.6 |
| Black/Ag Resistivity mohm/sq @ 5 um | 10.9 | 11.4 | 12.0 | 11.7 | 12.1 | 9.8 | 11.6 | 11.9 | 13.1 | 13.3 | 12.9 |
| Black resistance (Ohms) | 850k | >1 G | >1 G | >1 G | >1 G | >1 G | >1 G | >1 G | >1 G | >1 G | 430k |

\* High level of blistering has adversely affected fired thickness, edge curl and resistivity data.
NT—Not tested Photo properties (as determined by line resolution) of all examples (1-10) are similar to the control (DC243/DC209).

In all properties, example 1 performs similar to the control (DC243/DC209).

Comparing examples 1 and 2, increasing SA of the BaRuthenate conductive improves black color and conductivity.

Some examples (5-10) exhibited high levels of blistering when fired at 550° C. When fired at 500° C., the level of blistering was significantly reduced.

Application Examples 11-19

Further examples were prepared based on the following black conductive powders.

| Example | Black Conductive Oxide | Description | Specific Surface Area m$^2$/g |
|---|---|---|---|
| 11 | I | NdBa$_2$Cu$_3$O$_7$ | 1.0 |
| 12 | K | NdBa$_2$Cu$_3$O$_7$ | 6.0 |
| 13 | L | SrRuO$_3$ | 1.2 |
| 14 | M | SrRuO$_3$ | 5.6 |
| 15 | N | La2CuO4 | 6.3 |
| 16 | K | NdBa$_2$Cu$_3$O$_7$ | 6.0 |
| 17 | L | SrRuO$_3$ | 1.2 |
| 18 | M | SrRuO$_3$ | 5.6 |
| 19 | N | La$_2$CuO$_4$ | 6.3 |

Examples 11-15 contained 14 wt % of conductive oxide. In examples 16-19 the conductive level was doubled to 28 wt %.

Detailed compositions of examples 11-19 are shown in Table 3.

TABLE 3

Black Paste Composition in Weight Percent Total Black Paste Composition

| Ingredients | Example 11 | Example 12 | Example 13 | Example 14 | Example 15 | Example 16 | Example 17 | Example 18 | Example 19 |
|---|---|---|---|---|---|---|---|---|---|
| Organic binder A | 27.5 | 27.5 | 27.5 | 27.5 | 27.5 | 27.5 | 27.5 | 27.5 | 27.5 |
| monomer A | 6 | 6 | 6 | 6 | 6 | 6 | 6 | 6 | 6 |
| solvent A | 4.55 | 4.55 | 4.55 | 4.55 | 4.55 | 4.55 | 4.55 | 4.55 | 4.55 |
| Organic Additive A | 0.8 | 0.8 | 0.8 | 0.8 | 0.8 | 0.8 | 0.8 | 0.8 | 0.8 |
| Organic Additive B | 0.15 | 0.15 | 0.15 | 0.15 | 0.15 | 0.15 | 0.15 | 0.15 | 0.15 |
| Bi glass Frit A | 47 | 47 | 47 | 47 | 47 | 33 | 33 | 33 | 33 |
| Conductive oxide I | 14 | | | | | | | | |
| Conductive oxide K | | 14 | | | | | | | |
| Conductive oxide L | | | 14 | | | | | | |
| Conductive oxide M | | | | 14 | | | | | |
| Conductive oxide N | | | | | 14 | | | | |
| Conductive oxide K | | | | | | 28 | | | |
| Conductive oxide L | | | | | | | 28 | | |
| Conductive oxide M | | | | | | | | 28 | |

TABLE 3-continued

Black Paste Composition in Weight Percent Total Black Paste Composition

| Ingredients | Example 11 | Example 12 | Example 13 | Example 14 | Example 15 | Example 16 | Example 17 | Example 18 | Example 19 |
|---|---|---|---|---|---|---|---|---|---|
| Conductive oxide N | | | | | | | | | 28 |

Examples 2-10 all used conductive with low SA, their L values were high, and black only conductivity was >1 Gohm. Examples 11-19 are designed to show that by either: using higher SA black conductive, and/or increased level of black conductive in paste, and/or using a higher thickness black electrode, L value and black conductivity can be improved.

Examples 11-19 were therefore tested in the single layer (black only) configuration.

TABLE 4

| Black Conductive Paste | Example 11 | Example 12 | Example 13 | Example 14 | Example 15 | Example 16 | Example 17 | Example 18 | Example 19 |
|---|---|---|---|---|---|---|---|---|---|
| Ag Paste | A | A | A | A | A | A | A | A | A |
| Black Conductive | I | K | L | M | N | K | L | M | N |
| Black Conductive level (wt %) | 14 | 14 | 14 | 14 | 14 | 28 | 28 | 28 | 28 |
| Black Conductive SA m$^2$/g | 1.0 | 6.0 | 1.2 | 5.6 | 6.3 | 6.0 | 1.2 | 5.6 | 6.3 |
| Dried Black thickness 1 layer (um) | 6.8 | 6.6 | 7.1 | 7.2 | 6.9 | 6.6 | 7.0 | 6.8 | 6.4 |
| Dried Black thickness 2 layers (um) | 13.2 | 13.3 | 14.9 | 14.0 | 12.8 | 13.3 | 14.6 | 13.9 | 13.0 |
| L Color - 1 Black Layer | 54.4 | 53.5 | 32.5 | 5.0 | 33.6 | 6.8 | 5.1 | 4.7 | 6.6 |
| L color - 2 Black Layers | 39.2 | 40.8 | 7.3 | 4.8 | 11.5 | 7.3 | 4.9 | 4.7 | 6.8 |
| Black Resistance (Ohms) 1 Black Layer | >1 G | >1 G | >1 G | >1 G | >1 G | >1 G | 2.4k | 1.5k | >1 G |
| Black Resistance (Ohms) 2 Black Layers | >1 G | >1 G | >1 G | >1 G | >1 G | >1 G | 580 | 840 | >1 G |

All examples show that L-value is lowered when the black electrode thickness increased, except where L-value is already at a low value (<10). All examples show that L-value is lowered when conductive level in the black electrode is increased, except where L-value is already at a low value (<10).

In examples 1-2, and 13-14, L-value is lowered when SA of the black conductive is increased.

Examples 17-18 show that black resistance is lowered when the black electrode thickness increased.

Examples 13-17, 14-18 show that black resistance is lowered when conductive level in the black electrode is increased.

Examples 1-2 show that black resistance is lowered when SA of the black conductive is increased.

What is claimed is:

1. A composition comprising:
   (I) finely divided particles of inorganic material comprising:
   (c) a metal oxide with metallic or semi-metallic conductivity selected from an oxide of two or more elements selected from Ba, Ru, Ca, Cu, Sr, Bi, Pb, and the rare earth metals wherein said metal oxide has a surface to weight ratio in the range of 2 to 20 m$^2$/g;
   (d) inorganic binder having a glass transition temperature in the range of from 300 to 600° C., a surface area to weight ratio of no greater than 10 m$^2$/g and at least 85 wt. % of the particles having a size in the range of 0.1-10 μm, wherein said inorganic binder comprises, based on weight percent total glass binder composition: 55-85% $Bi_2O_3$, 0-20% $SiO_2$, 0-5% $Al_2O_3$, 2-20% $B_2O_3$, 0-20% ZnO, 0-15% of one or more of oxides selected from BaO, CaO, and SrO; and 0-3% of one or more of oxides selected from $Na_2O$, $K_2O$, $Cs_2O$, $Li_2O$ and mixtures thereof;

dispersed in:
   (II) an organic medium comprising;
   (c) aqueous developable photocrosslinkable polymer which is a copolymer, interpolymer or mixture thereof, wherein each copolymer or interpolymer comprises (1) a nonacidic comonomer comprising a $C_{1-10}$ alkyl acrylate, $C_{1-10}$ alkyl methacrylate, styrene, substituted styrene or combination thereof and (2) an acidic comonomer comprising ethylenically unsaturated carboxylic acid containing moiety, wherein 2-20% of the carboxylic acid containing moiety is reacted with a reactive molecule having a first and second functional unit wherein the first functional unit is a vinyl group and the second functional unit is capable of forming a chemical bond by reaction with the carboxylic acid moiety; forming the copolymer, interpolymer or mixture thereof having an acid content of at least 10 wt. % of the total polymer weight; a glass transition temperature in the range of 50-150° C. and a weight average molecular weight in the range of 2,000-250,000; and organic solvent and wherein said glass binder composition is lead-free.

2. The composition of claim 1 wherein said metal oxide with metallic or semi-metallic conductivity is selected from an oxide of two or more elements selected from Ba, Ru, Ca, Cu, La, Sr, Y, Nd, Bi, and Pb.

3. The composition of claim 1 wherein the vinyl group is selected from a methacrylate, acrylate group or mixtures thereof.

4. The composition of claim 1 wherein the second functional unit is selected from an epoxide, alcohol, amine or mixtures thereof.

5. The composition of claim 1 wherein the inorganic material further comprises $RuO_2$, ruthenium-based polynary oxides or mixtures thereof.

6. The composition of claim 1 wherein the inorganic material further comprises Au, Ag, Pd, Pt, Cu or mixtures thereof.

7. The composition of claim 1 wherein the organic medium further comprises a photoinitiation system.

8. The composition of claim 1 wherein the organic medium further comprises a photohardenable monomer.

9. The composition of claim 1 which is in the form of a paste suitable for screen-printing.

10. A sheet comprising a layer of the composition of claim 1 wherein the composition has been dried to remove the organic solvent.

11. An article comprising a layer of the composition of claim 1 wherein the composition has been heated to substantially remove the organic medium and substantially sinter the inorganic material.

12. A black electrode formed from the composition of claim 1.

13. A single layer black electrode formed from the composition of claim 6.

14. A flat panel display device comprising the electrode of either of claim 12 or 13.

* * * * *

UNITED STATES PATENT AND TRADEMARK OFFICE
CERTIFICATE OF CORRECTION

PATENT NO. : 7,569,165 B2  
APPLICATION NO. : 11/369551  
DATED : August 4, 2009  
INVENTOR(S) : Michael F Barker, Keiichiro Hayakawa and Jerome David Smith Page 1 of 1

It is certified that error appears in the above-identified patent and that said Letters Patent is hereby corrected as shown below:

Column 25, Line 60: "(c)" should read -- (a) --  
Column 25, Line 65: "(d)" should read -- (b) --  
Column 26, Line 42: "(c)" should read -- (a) --  
Column 26, Line 62: "organic solvent..." should read -- (b) organic solvent... --

Signed and Sealed this

Twenty-fourth Day of November, 2009

David J. Kappos  
*Director of the United States Patent and Trademark Office*